(12) United States Patent
Shabalin

(10) Patent No.: US 10,797,613 B1
(45) Date of Patent: Oct. 6, 2020

(54) POWER SUPPLY SYSTEM WITH ACTIVELY SWITCHED BUS CAPACITOR

(71) Applicant: Advanced Energy Industries, Inc., Fort Collins, CO (US)

(72) Inventor: Andrew Shabalin, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/376,405

(22) Filed: Apr. 5, 2019

(51) Int. Cl.
*H02M 7/219* (2006.01)
*H03K 5/24* (2006.01)
*G05F 1/56* (2006.01)
*H02M 1/00* (2006.01)

(52) U.S. Cl.
CPC .............. *H02M 7/219* (2013.01); *G05F 1/56* (2013.01); *H03K 5/24* (2013.01); *H02M 2001/0003* (2013.01)

(58) Field of Classification Search
CPC .................................................. H02M 7/129
See application file for complete search history.

(56) References Cited

U.S. PATENT DOCUMENTS

| 5,535,906 | A | 7/1996 | Drummond |
| 6,118,676 | A | 9/2000 | Divan et al. |
| 7,541,696 | B2 | 6/2009 | Dawley |
| 8,358,098 | B2 | 1/2013 | Skinner et al. |
| 2009/0273954 | A1 | 11/2009 | Walde |
| 2013/0258722 | A1* | 10/2013 | Wang .................. H02M 1/4258 363/21.12 |
| 2015/0028841 | A1* | 1/2015 | Cesnak .................. H02M 1/34 323/311 |
| 2015/0327340 | A1* | 11/2015 | Siessegger ......... H05B 33/0818 315/200 R |
| 2018/0097391 | A1* | 4/2018 | Baby ..................... H02J 7/0093 |

OTHER PUBLICATIONS

Hauqe, Shah, "International Search Report and Written Opinion Regarding International Application No. PCT/US2020/022858", dated Jun. 10, 2020, p. 9 Published in: AU.

* cited by examiner

*Primary Examiner* — Jue Zhang
*Assistant Examiner* — Trinh Q Dang
(74) *Attorney, Agent, or Firm* — Neugeboren O'Dowd PC

(57) ABSTRACT

Disclosed are power supply systems and methods of operating the same. An exemplary power supply system includes a primary rectifier configured to rectify an AC voltage to produce a bus voltage on a DC bus and a voltage monitor configured to monitor the AC voltage. A capacitor is switchably coupled to the DC bus via a switch and a charger is configured to charge the capacitor with power from the DC bus. A switch controller is configured to close, in response to the voltage monitor indicating a sag in at least one phase of the AC voltage, the switch to enable the capacitor to discharge to the DC bus.

10 Claims, 7 Drawing Sheets

Insulated Gate Bipolar Transistor
with Integrated Diode

POWER SUPPLY SYSTEM WITH ACTIVELY SWITCHED BUS CAPACITOR

BACKGROUND

Field

This invention relates generally power supply systems, and more specifically, this invention relates to providing consistent power within power supply systems.

Background

Power supply systems are well known and are utilized in connection with a variety of different applications. For example, power supply systems are used for integrated circuit manufacture, circuit board etching apparatuses, physical vapor deposition chambers, chemical vapor deposition chambers, and devices for various other applications.

It is common for power supply systems to include a bridge rectifier for generating a DC voltage from an AC mains voltage, and the DC voltage may be used as an input to a generator section that may produce different types of waveforms at varying frequencies. For example, sinusoidal and square waves may be produced at frequencies that range from kilohertz to over 100 MHz.

During a drop in the AC mains voltage, energy is needed to provide power to the generator. One solution is to connect a large bus capacitor to the output of AC rectifier. This solution is simple, but it results in a diminished power factor. Also, the minimum value of bus capacitance is dictated by a maximum ripple current of the capacitor. This results in a bus capacitance that is larger than required, and this solution works best for small power applications such as auxiliary power supplies.

Another solution is to use a boost (or buck) converter to charge a bus capacitor to a constant voltage. But this type of solution can be complicated and may require a large number of parts, which may include relatively expensive high-power components. Thus, present solutions are inadequate, expensive, or otherwise unsatisfactory.

SUMMARY

According to an aspect, a power supply system includes a primary rectifier configured to rectify an AC voltage to produce a bus voltage on a DC bus. A voltage monitor is configured to monitor the AC voltage, and a capacitor is switchably coupled to the DC bus via a switch. A charger is configured to charge the capacitor with power from the DC bus, and a switch controller is configured to close, in response to the voltage monitor indicating a sag in at least one phase of the AC voltage, the switch to enable the capacitor to discharge to the DC bus.

In accordance with other aspects, a method is disclosed for providing power in a power supply system. The method includes applying a bus voltage to a DC bus by rectifying an AC voltage and monitoring the AC voltage. A capacitor is coupled to the DC bus via a switch, and the capacitor is charged with the bus voltage while the switch is open. The switch is closed to discharge the capacitor to the DC bus when the monitored AC voltage indicates a sag has occurred.

These and various other features as well as advantages, which characterize the present invention, will be apparent from a reading of the following detailed description and a review of the associated drawings.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
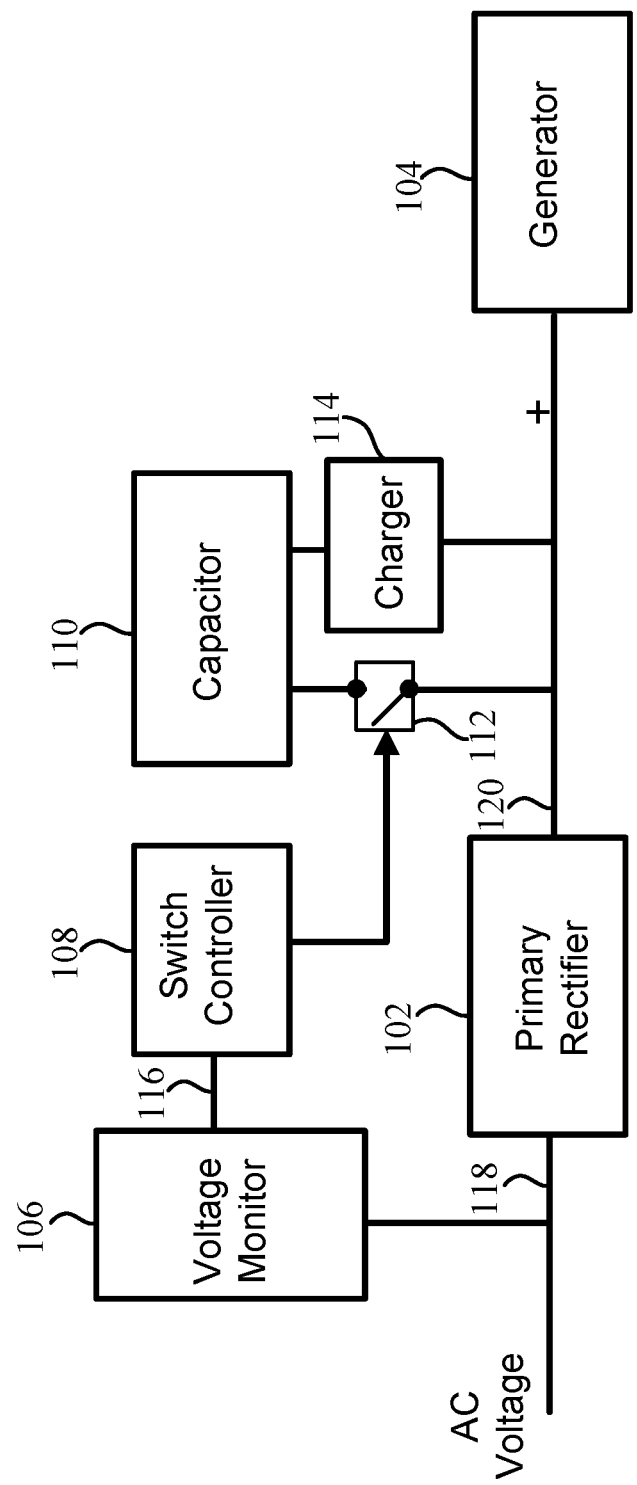
FIG. 1 is a block diagram depicting aspects of a power supply system.

Referring first to FIG. 1, shown is a power supply system according to an exemplary embodiment. In the system of FIG. 1, an AC voltage is received by a primary rectifier 102 that converts the AC voltage to a rectified voltage that is used by a generator 104. The AC voltage is typically three-phase voltage that may be, for example, 280 Volts or 480 Volts, but another number of phases and other voltages may be utilized. As those of ordinary skill in the art will appreciate, the primary rectifier 102 may be implemented by a variety of different types of rectifiers that function to rectify the AC voltage of the AC mains to DC voltage. The generator 104 generally depicts any of a variety of generators that convert a DC voltage to another DC voltage, pulsed DC voltage, or one or more of any of a variety of different waveforms at frequencies that may vary from a few Hertz to over 100 MHz. Common frequencies that have many applications, for example, are frequencies from 400 kHz to over 100 MHz, but the frequency of the generator 104 may be any useful frequency.

Also shown in FIG. 1 are a voltage monitor 106, a switch controller 108, a capacitor 110, a switch 112, and a charger 114. The voltage monitor 106 generally functions to provide an output signal 116 that is indicative of the AC voltage at an input 118 of the primary rectifier 102, and when the output signal 116 of the voltage monitor 106 indicates there is a sag in the AC voltage, the switch controller 108 operates to close the switch 112 so that the capacitor 110 is coupled to the DC bus 120 in order to mitigate against a drop in the DC voltage of the DC bus 120. As shown, the charger 114 is coupled to both the capacitor 110 and the DC bus 120, and the charger 114 functions to charge the capacitor 110 so the capacitor 110 is to ready to provide a DC voltage to the DC bus 120 when the switch 112 is closed. An aspect of this implementation is that there are no restrictions on the value of the capacitor 110, and hence, there is no reasonable restriction on the amount of the stored energy that is available. As those of ordinary skill in the art will appreciate, the capacitor 110 may be realized by a bank of capacitors, and each of the capacitors in the bank of capacitors may be realized by any of a variety of capacitor types such as, without limitation, electrolytic capacitors.

Figure 2A:
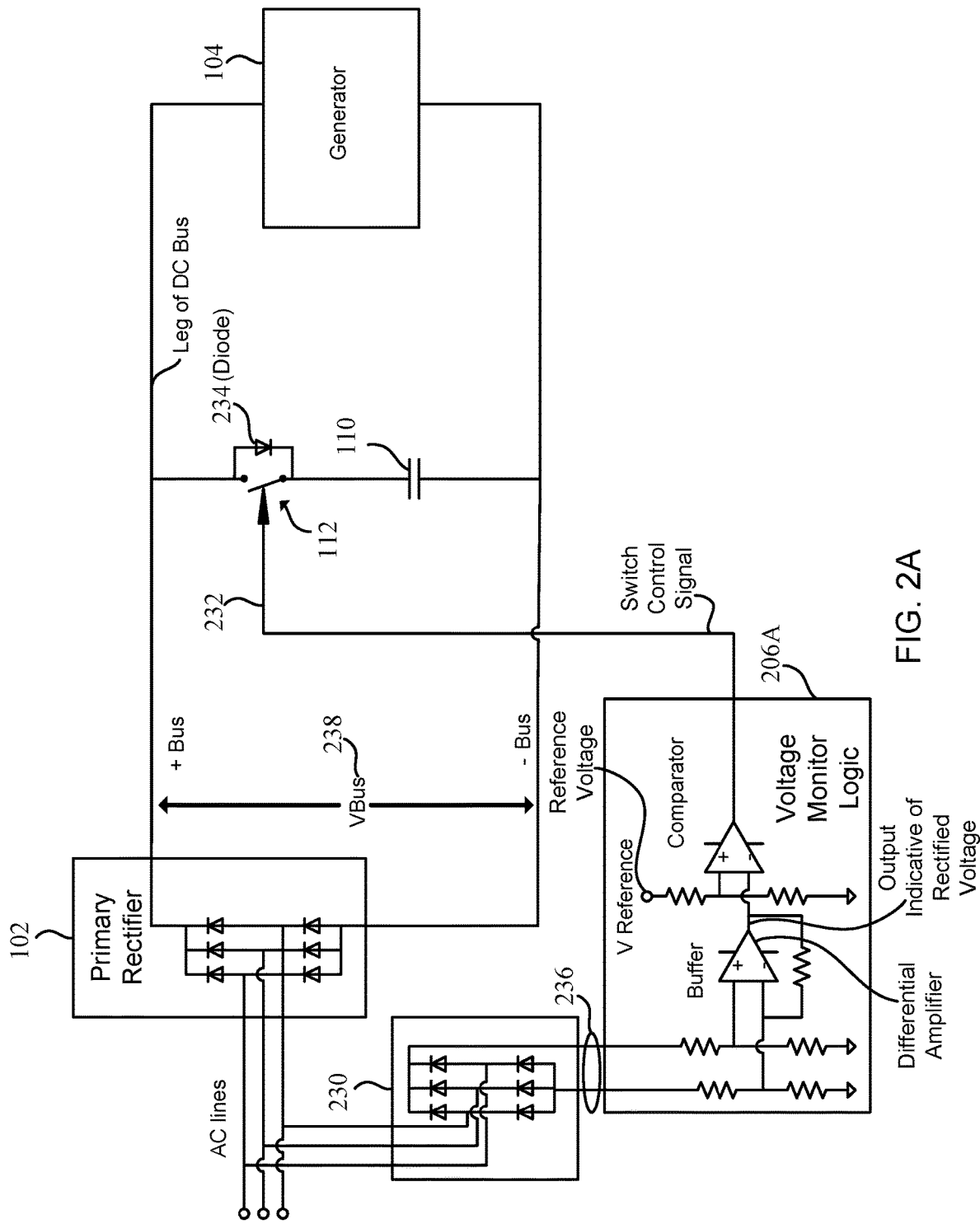
FIG. 2A shows a schematic diagram of several components of the power supply system of FIG. 1.

Referring next to FIG. 2A, shown is a schematic diagram depicting several components that may be used to realize the functional components depicted in FIG. 1. As shown, the primary rectifier 102 may be realized by a passive, six-pulse, bridge rectifier that is configured to rectify a three-phase AC voltage to a voltage (Vbus) that is provided to the generator 104. As those of ordinary skill in the art will appreciate, the generator 104 may utilize a voltage-controlled oscillator to generate a source signal that is converted to an output voltage by switch-mode components within the generator 104. Further details of the various alternative potential implementations of the generator 104 are omitted because the generator 104 may be implemented by any of a variety of known devices that use rectified AC voltage to operate.

In the implementation of FIG. 2A, the voltage monitor 106 of FIG. 1 is implemented by an auxiliary rectifier 230 in combination with voltage monitor logic 206A. As shown, the auxiliary rectifier 230 may be implemented by the same type of technology as the primary rectifier 102, but this is not required, and the auxiliary rectifier 230 may be implemented by other types of rectifiers. The voltage monitor logic 206A may be realized by a buffer that operates as a differential amplifier to provide an output indicative of the rectified voltage output by the auxiliary rectifier 230. As shown, a comparator of the voltage monitor logic 206A is disposed to compare the voltage output by the buffer with a reference voltage and if a difference between the reference voltage and the voltage output by the buffer exceed a threshold (which indicates a sag on the AC lines), the comparator outputs a switch signal 232 to close the switch; thus placing the capacitor 110 across the DC bus 120.

As shown, the charger 114 depicted in FIG. 1 is realized by a diode 234 in the implementation depicted in FIG. 2A. In some implementations, the switch 112 may be realized by an insulated gate bipolar transistor (IGBT), and in these implementations, the diode 232 may be a separate diode, or diode inside the IGBT packaging. In other implementations, the switch 112 may be realized by a field effect transistor (FET), and in these implementations, the diode 232 may be an inherent diode of the FET. Another type of semiconductor switching device, or a mechanical switch also can be used. And in these other implementations, the diode may be implemented as a separate device.

Figure 2B:
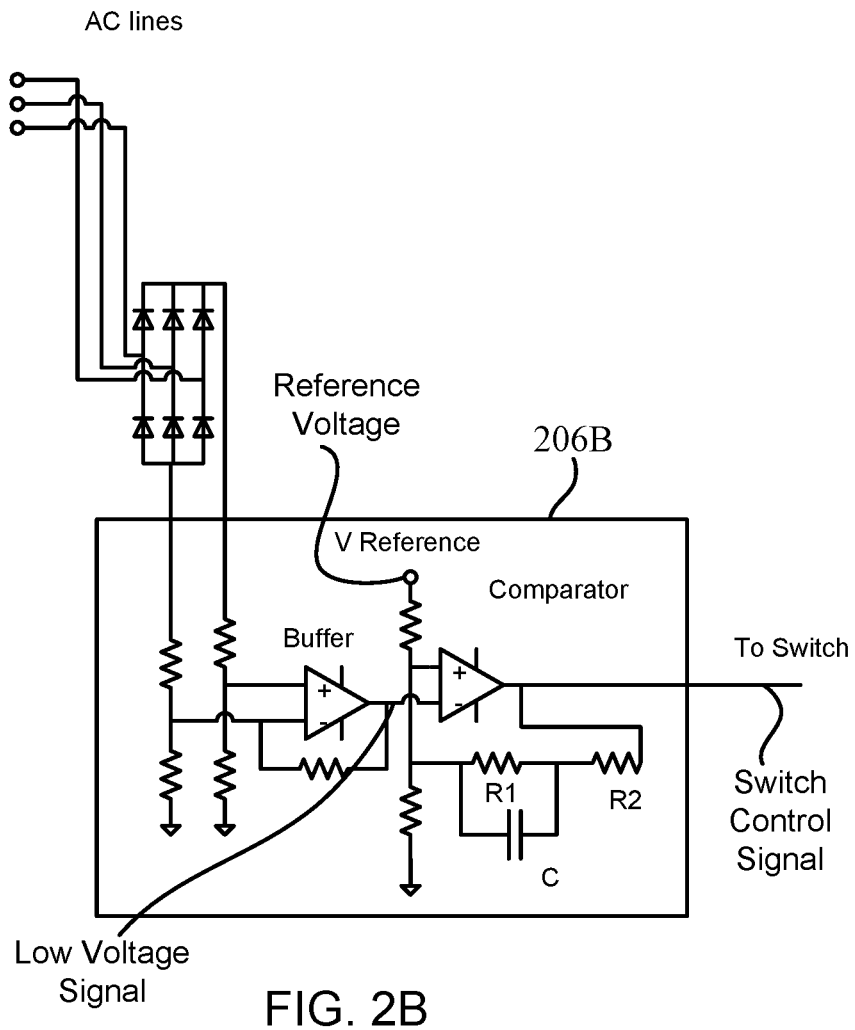
FIG. 2B shows a schematic diagram of a variation of the voltage monitor logic of FIG. 2A.
Figure 2C:
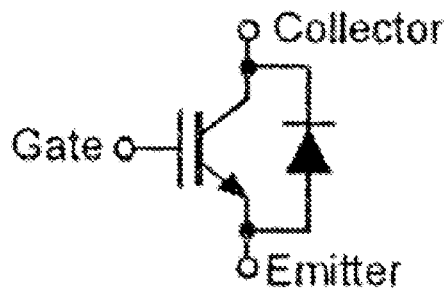
FIG. 2C depicts an insulated gate bipolar transistor.

Some aspects of the embodiment depicted in FIGS. 1 and 2 are that a power factor is not affected, and a number of additional components is kept to minimum, with only one high power component added (e.g., an IGBT or FET switch). Moreover, there is no ripple current through the capacitor 110, and as a consequence, the individual capacitors making up the capacitor 110 stay cooler than in prior approaches. In addition, the capacitor 110 may be charged to the maximum bus voltage; thus, the system architecture improves energy storage for a capacitor.

Referring net to FIG. 2B, shown a schematic diagram of voltage monitor logic 206B that is a variation of the voltage monitor logic of FIG. 2A to implement three thresholds: a static-on-threshold, a static-off-threshold, and a dynamic-off-threshold. The dynamic-off-threshold may be used immediately after the switch 112 is turned on and gradually drops to the static-off-threshold. The thresholds may be set so that the dynamic-on-threshold is a lowest threshold value, the static-off-threshold is the next highest value, and the dynamic-off-threshold is the highest threshold value.

In the voltage monitor logic 206B of FIG. 2B FIG. 2, a total sum value of resistors R1+R2 define a static hysteresis (a difference between the static-on-threshold and the static-off-threshold values); R2 defines a hysteresis value of the dynamic-off-threshold right after a switching event; and a capacitance, C, defines a transition time from the hysteresis value to the static-off-threshold. By utilizing thresholds in this way, a short-cycling of the switch 112 is avoided. Moreover, having a high initial value for the dynamic-off-threshold helps to prevent any voltage spikes (that may occur when the capacitor 110 is coupled to the DC bus 120) from triggering the switch to open. Over a period of time after the switch 112 is closed, a likelihood of voltage spikes decreases, and as a consequence, the dynamic-off-threshold may decrease to the static-off-threshold.

In alternative implementations, the switch-controller 108 may be implemented by a processor (e.g., microprocessor) in connection with non-transitory processor-executable instructions (e.g., software) stored in non-volatile memory. In these alternative implementations, the three thresholds may be parameter values that a user may change via user interface and/or by changing lines of software code. Additional details of these types of implementations is provided with reference to FIG. 6 below.

Figure 3:
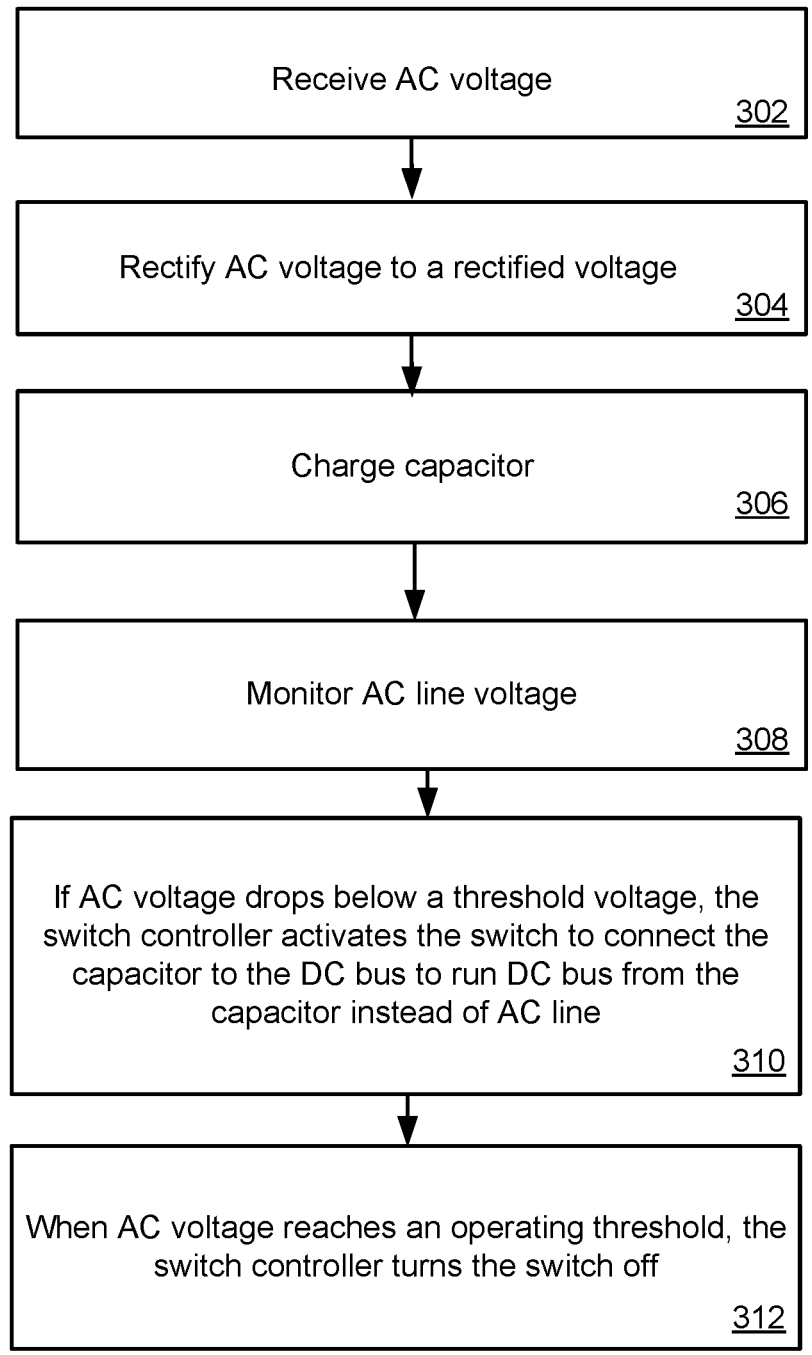
FIG. 3 is a flowchart depicting a method that may be traversed in connection with embodiments disclosed herein.
Figure 4A:
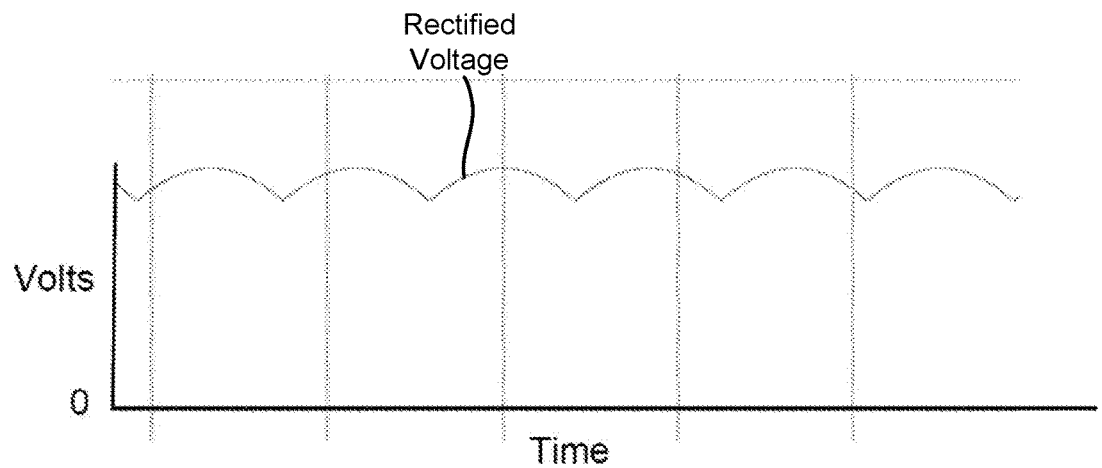
FIG. 4A is a waveform depicting a rectified voltage at an output of the primary rectifier depicted in FIG. 2A.

While referring to FIGS. 2A, 2B and 3, simultaneous reference is made to FIG. 3, which is a flowchart depicting a method that may be traversed in connection with embodiments disclosed herein. In operation, the primary rectifier 102 receives and rectifies an AC voltage (Blocks 302 and 304). Referring briefly to FIG. 4A, shown is a depiction of a rectified AC voltage that may be output from the primary rectifier 102 to the DC bus 120. Those of ordinary skill in the art will appreciate that the rectified voltage depicted in FIG. 4A may be further filtered to remove ripple from the waveform.

During normal operation (e.g., when the AC line voltage is within a nominal operating range), the charger 114 charges the capacitor 114 (e.g., through the diode 234) so that the capacitor 110 remains charged to a voltage that is approximately the maximum bus voltage during normal operation (Block 306). Those of ordinary skill in the art will appreciate that during initial power-up, the capacitor 110 may be charged slowly by a separate, specialized circuit.

As shown, the voltage monitor 106 monitors the AC line voltage (e.g., by monitoring a voltage output 236 by the auxiliary rectifier 230)(Block 308), and if the output voltage 236 of the auxiliary rectifier 230 drops below a predefined threshold, the switch controller 108 activates the switch 112 (e.g., to an ON state) to close the switch 112, and the switch 112 connects the capacitor 110 to the DC bus 120, so the DC bus 120 is run from the capacitor 100 instead of the AC line (Block 310).

Figure 4B:
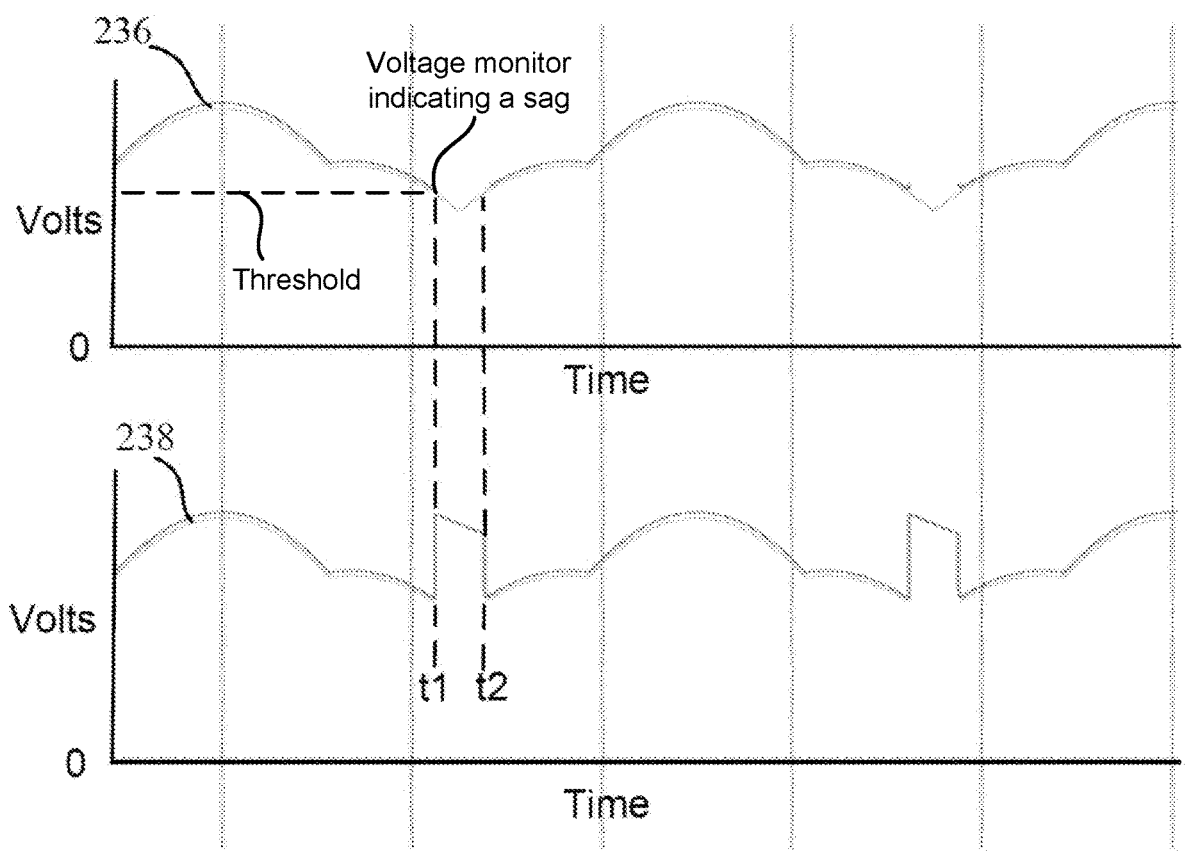
FIG. 4B depicts waveforms of the rectified voltage at the output of the auxiliary rectifier and the primary rectifier of FIG. 2A when there is a drop in an AC voltage.

Referring briefly to FIG. 4B for example, when a voltage of at least one phase of the AC line voltage drops, the output voltage 236 of the auxiliary rectifier 230 will also drop. And when the output voltage 236 of the auxiliary rectifier 230 (drops at a time t1) to a threshold level (e.g., the static-on-threshold) corresponding to drop in the AC line voltage, the switch 112 is closed. And when the switch 112 is closed, the DC bus 120 operates off the capacitor 110 resulting in a jump in a DC bus voltage 238, and then the DC bus voltage 238 slowly drops between times t1 and t2 while the capacitor 110 is discharging.

When the AC voltage increases to an operating level (as indicated by the voltage output 236 by the auxiliary rectifier 230 at the time t2), the switch controller 108 opens the switch 112 (e.g., by turning the switch OFF)(Block 312).

When the switch 112 is open, the capacitor 110 is connected to DC bus 120 through the diode, and the voltage 238 of DC bus 120 drops (as shown at the time t2) and then increases to be similar to the output voltage 236 of the auxiliary rectifier 230.

Figure 5:
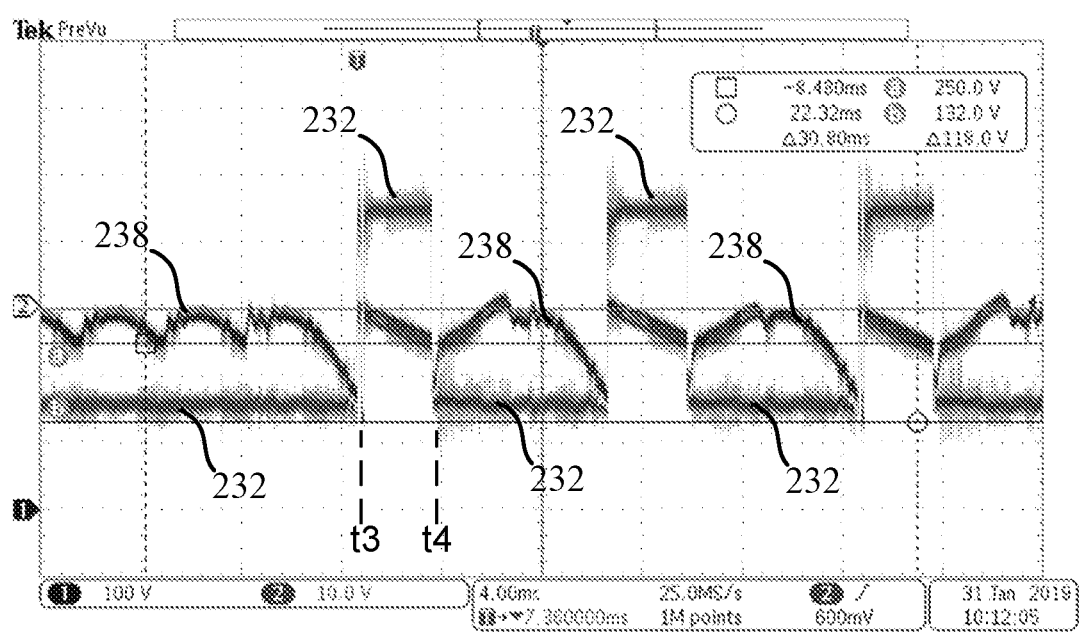
FIG. 5 depicts a waveform of the rectified voltage at the output of the primary rectifier and a voltage of a switch control signal.

FIG. 5 depicts a rectified voltage 238 output by the primary rectifier 102 and a switch control signal 232 that may be output from the switch controller 108 to the switch 112. As shown, at a time t3, in response to a drop in the voltage 236 output by the auxiliary rectifier 230 (not shown in FIG. 5), the switch control signal 232 is turned ON, which causes the switch 112 to close (from times t3 to t4); thus, the capacitor 110 is coupled to the DC bus 120, which results in the rectified voltage 238 rising. As shown in FIG. 5, the rectified voltage 238 output from the primary rectifier 102 does drop at time t3, but in many implementations, the voltage output 236 by the auxiliary rectifier 230 is utilized as a monitored point for feedback. Using the voltage output 236 by the auxiliary rectifier 230 is beneficial (as opposed to using the rectified voltage 238 from the primary rectifier 102 as a monitored point for feedback) because the voltage output 236 by the auxiliary rectifier 230 is less affected by the capacitor 110 than the rectified voltage 238 from the primary rectifier 102; thus, the voltage output 236 by the auxiliary rectifier 230 provides a more accurate reflection of AC voltages on the AC lines.

Figure 6:
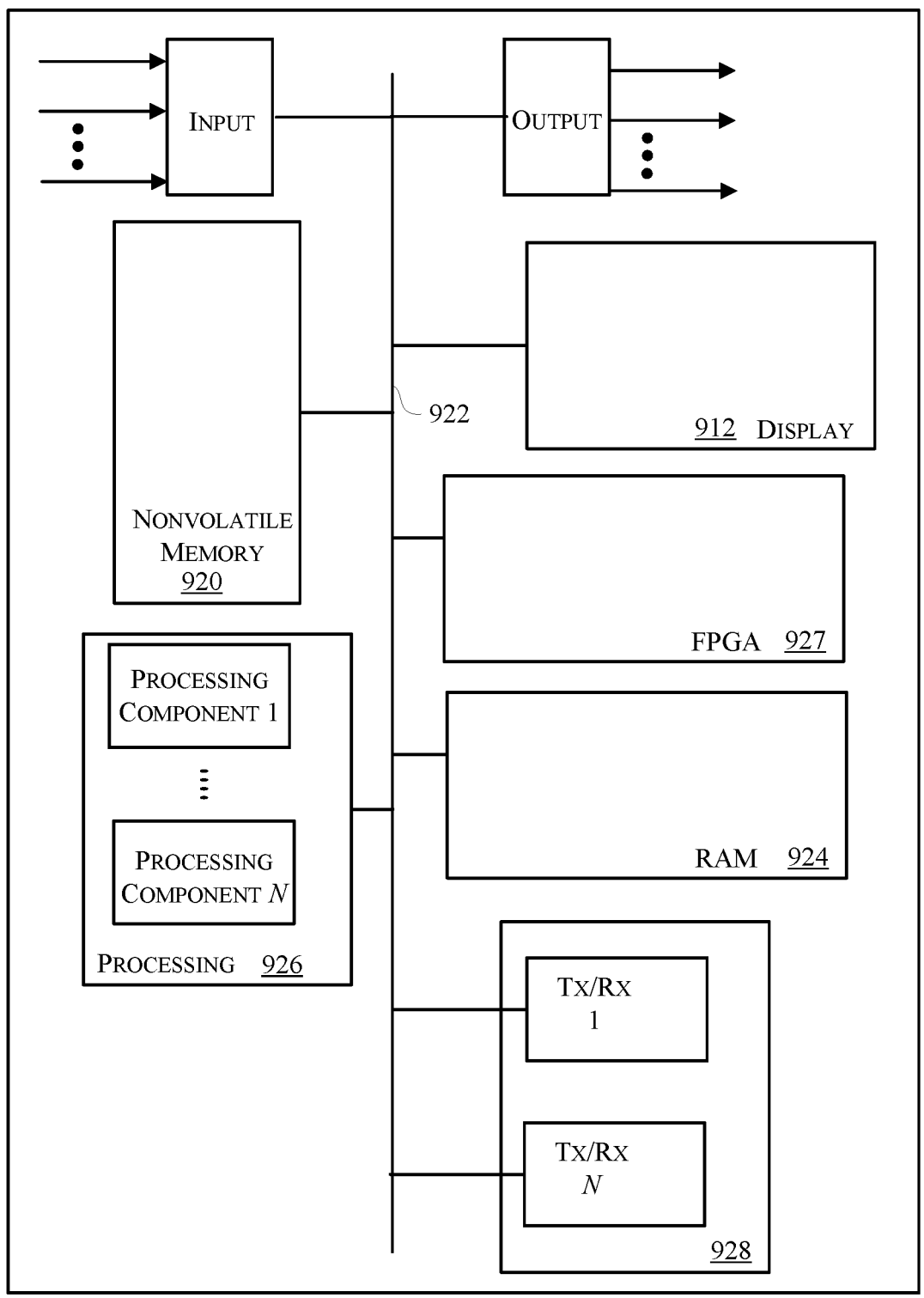
FIG. 6 is a block diagram depicting physical components that may be utilized in some embodiments.

Aspects of the present disclosure may be embodied directly in hardware (e.g., the voltage monitor logic 206A, 206B), in processor executable instructions encoded in non-transitory machine readable medium, or as a combination of the two. Referring to FIG. 6 for example, shown is a block diagram depicting physical components that may be utilized to realize one or more aspects of the voltage monitor 106 and switch controller 108 according to an illustrative embodiment of this disclosure. As shown, in this embodiment a display portion 912 and nonvolatile memory 920 are coupled to a bus 922 that is also coupled to random access memory ("RAM") 924, a processing portion (which includes N processing components) 926, a field programmable gate array (FPGA) 927, and a transceiver component 928 that includes N transceivers. Although the components depicted in FIG. 6 represent physical components, FIG. 6 is not intended to be a detailed hardware diagram; thus, many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

A display portion 912 generally operates to provide a user interface for a user, and in several implementations, the display is realized by a touchscreen display. For example, display portion 912 can be used to control and interact with the switch controller to establish thresholds for turning on and off the switch 112. In general, the nonvolatile memory 920 is non-transitory memory that functions to store (e.g., persistently store) data and machine readable (e.g., processor executable) code (including executable code that is associated with effectuating the methods described herein). In some embodiments, for example, the nonvolatile memory 920 includes bootloader code, operating system code, file system code, and non-transitory processor-executable code to facilitate the execution of the methods described herein.

In many implementations, the nonvolatile memory 920 is realized by flash memory (e.g., NAND or ONENAND memory), but it is contemplated that other memory types may be utilized as well. Although it may be possible to execute the code from the nonvolatile memory 920, the executable code in the nonvolatile memory is typically loaded into RAM 924 and executed by one or more of the N processing components in the processing portion 926.

In operation, the N processing components in connection with RAM 924 may generally operate to execute the instructions stored in nonvolatile memory 920 to realize the functionality of the voltage monitor 106 and switch controller 108. For example, non-transitory processor-executable instructions to effectuate the methods described herein may be persistently stored in nonvolatile memory 920 and executed by the N processing components in connection with RAM 924. As one of ordinary skill in the art will appreciate, the processing portion 926 may include a video processor, digital signal processor (DSP), graphics processing unit (GPU), and other processing components.

In addition, or in the alternative, the field programmable gate array (FPGA) 927 may be configured to effectuate one or more aspects of the methodologies described herein (e.g., the methods described with reference to FIG. 3). For example, non-transitory FPGA-configuration-instructions may be persistently stored in nonvolatile memory 920 and accessed by the FPGA 927 (e.g., during boot up) to configure the FPGA 927 to effectuate the functions of the voltage monitor 106 and the switch controller 108.

The input component may operate to receive signals (e.g., from sensors coupled to the output of the auxiliary rectifier 230) that are indicative of a voltage of the rectified voltage. The output component generally operates to provide one or more analog or digital signals to effectuate an operational aspect of the switch controller 108. For example, the output portion may transmit the switch control signal (a DC control signal) to the switch 112.

The depicted transceiver component 928 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power supply system comprising:
    a primary rectifier configured to rectify an AC voltage to produce a bus voltage on a DC bus;
    a voltage monitor configured to monitor the AC voltage;
    a capacitor switchably coupled to the DC bus via a switch, wherein a series combination of the switch and capacitor are coupled across outputs of the primary rectifier;
    a charger configured to charge the capacitor with power from the DC bus;
    a switch controller configured to close, in response to the voltage monitor indicating a sag in at least one phase of the AC voltage, the switch to enable the capacitor to discharge to the DC bus.

2. The power supply system of claim 1, wherein the voltage monitor includes an auxiliary rectifier and the voltage monitor is configured to monitor the AC voltage by monitoring a rectified voltage that is output from the auxiliary rectifier.

3. The power supply of claim 1, wherein the charger includes a diode arranged between a leg of the DC bus and the capacitor, wherein the diode is arranged in parallel with the switch.

4. The power supply system of claim 2, wherein the voltage monitor includes:
   a differential amplifier to provide an output indicative of the rectified voltage of the auxiliary rectifier;
   a comparator to compare the output of the differential amplifier with a reference voltage, wherein the comparator is configured to provide a switch control signal to the switch controller to trigger the switch controller to close the switch in response to the sag.

5. The power supply of claim 3, wherein the switch is an insulated gate bipolar transistor and the diode is integrated within the insulated gate bipolar transistor.

6. The power supply system of claim 3, wherein the diode is a separate component from the switch.

7. A method for providing power in a power supply system, the method comprising:
   applying a bus voltage across outputs of a rectifier by rectifying an AC voltage with the rectifier;
   monitoring the AC voltage;
   coupling a series combination of a capacitor and a switch across the outputs of the rectifier;
   charging the capacitor with the bus voltage while the switch is open; and
   closing the switch to discharge the capacitor to the DC bus when the monitored AC voltage indicates a sag has occurred.

8. The method of claim 7 wherein monitoring includes:
   rectifying the AC voltage with an auxiliary rectifier to produce a rectified voltage;
   monitoring the rectified voltage to determine whether the AC voltage drops below a threshold.

9. The method of claim 8, wherein monitoring includes:
   producing a low voltage signal indicative of the rectified voltage of the auxiliary rectifier;
   comparing the low voltage signal with a reference voltage and providing a switch control signal to trigger the switch to close when a difference between the low voltage signal and the reference voltage indicates AC voltage has dropped.

10. The method of claim 7, including:
   charging the capacitor with a diode arranged in parallel with the capacitor.

* * * * *